(12) United States Patent
Hirakata et al.

(10) Patent No.: US 7,977,150 B2
(45) Date of Patent: Jul. 12, 2011

(54) METHOD FOR MANUFACTURING AN ORGANIC SEMICONDUCTOR ELEMENT

(75) Inventors: Yoshiharu Hirakata, Kanagawa (JP); Tetsuji Ishitani, Kanagawa (JP); Shuji Fukai, Kanagawa (JP); Ryota Imahayashi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 12/683,193

(22) Filed: Jan. 6, 2010

(65) Prior Publication Data

US 2010/0151621 A1    Jun. 17, 2010

Related U.S. Application Data

(63) Continuation of application No. 11/011,060, filed on Dec. 15, 2004, now Pat. No. 7,659,138.

(30) Foreign Application Priority Data

Dec. 26, 2003    (JP) .................. 2003-434620

(51) Int. Cl.
*H01L 51/40* (2006.01)

(52) U.S. Cl. .......... 438/99; 438/149; 438/158; 438/240; 438/E21.006; 257/40

(58) Field of Classification Search .............. 438/99, 438/149, 158, 216, 240; 257/40
See application file for complete search history.

(56) References Cited

U.S. PATENT DOCUMENTS

| | | | |
|---|---|---|---|
| 5,574,291 A | 11/1996 | Ddabalapur et al. | |
| 5,705,826 A | 1/1998 | Aratani et al. | |
| 5,946,551 A | 8/1999 | Dimitrakopoulos et al. | |
| 6,150,668 A | 11/2000 | Bao et al. | |
| 6,207,472 B1 | 3/2001 | Callegari et al. | |
| 6,300,988 B1 | 10/2001 | Ishihara et al. | |
| 6,326,640 B1 | 12/2001 | Shi et al. | |
| 6,335,539 B1 | 1/2002 | Dimitrakopoulos et al. | |
| 6,429,457 B1 | 8/2002 | Berggren et al. | |
| 6,433,359 B1 | 8/2002 | Kelley et al. | |
| 6,452,207 B1 | 9/2002 | Bao | |

(Continued)

FOREIGN PATENT DOCUMENTS

EP    0 716 458 A2    6/1996

(Continued)

OTHER PUBLICATIONS

Notice on First Office Action dated Nov. 28, 2008 in Chinese Patent Application No. 200410011448.X, People's Republic of China, 7 pages; with English translation, 12 pp.

(Continued)

*Primary Examiner* — Dung A. Le

(74) *Attorney, Agent, or Firm* — Nixon Peabody LLP; Jeffrey L. Costellia

(57) ABSTRACT

In manufacturing a device using an organic TFT, it is essential to develop an element in which a channel length is short or a channel width is narrow to downsize a device. Based on the above, it is an object of the present invention to provide an organic TFT in which characteristic is improved. In view of the foregoing problem, one feature of the present invention is that an element is baked after an organic semiconductor film is deposited. More specifically, one feature of the present invention is that the organic semiconductor film is heated under atmospheric pressure or under reduced pressure. Moreover, a baking process may be carried out in an inert gas atmosphere.

29 Claims, 13 Drawing Sheets

U.S. PATENT DOCUMENTS

| | | |
|---|---|---|
| 6,528,816 B1 | 3/2003 | Jackson et al. |
| 6,635,508 B2 | 10/2003 | Arai et al. |
| 6,905,908 B2 | 6/2005 | Zhang et al. |
| 7,015,502 B2 | 3/2006 | Arai et al. |
| 7,061,010 B2 | 6/2006 | Minakata |
| 2002/0012080 A1 | 1/2002 | Ishihara et al. |
| 2002/0022299 A1 | 2/2002 | Jackson |
| 2002/0155729 A1 | 10/2002 | Baldwin et al. |
| 2002/0164835 A1 | 11/2002 | Dimitrakopoulos et al. |
| 2002/0179901 A1 | 12/2002 | Arai et al. |
| 2003/0211649 A1* | 11/2003 | Hirai et al. ............ 438/48 |
| 2004/0191952 A1 | 9/2004 | Shtein et al. |
| 2005/0176196 A1 | 8/2005 | Zhang et al. |
| 2006/0208251 A1 | 9/2006 | Yoshizawa |
| 2006/0214252 A1* | 9/2006 | Hirai et al. ............ 257/462 |
| 2008/0063795 A1* | 3/2008 | Kim et al. ............ 427/126.1 |

FOREIGN PATENT DOCUMENTS

| | | |
|---|---|---|
| EP | 1 416 069 A1 | 5/2004 |
| JP | 08-228035 | 9/1996 |
| JP | 09-116163 | 5/1997 |
| JP | 2003-338629 | 11/2003 |
| WO | WO-03/016599 A1 | 2/2003 |

OTHER PUBLICATIONS

Yagi I. et al; "Pentacene FET Fabricated On Surface Treated $SiO_2$/Si Substrate," $50^{th}$ Japan Society of Applied Physics and Related Societies, Extended Abstract (Mar. 2003 in Kanagawa University); 29a-Λ-9, Mar. 2005; p. 1418.

Lee.J et al., "Annealing Effects on the Electrical Characteristics of Pentacene Thin Film Transistors,",Journal of the Korean Physical Society, Mar. 1, 2001, vol. 38, No. 3, pp. 282-285.

\* cited by examiner

METHOD FOR MANUFACTURING AN ORGANIC SEMICONDUCTOR ELEMENT

BACKGROUND OF THE INVENTION

1. Field of the Invention

The present invention relates to an organic semiconductor element having an organic semiconductor film and a method for manufacturing thereof.

2. Description of the Related Art

In recent years, a display device provided with a thin film transistor (hereinafter, a TFT) having a thin film semiconductor has been studied and put into practical use. A high-resolution display device can be achieved since a large number of pixels can be constituted in the display device provided with a TFT. Moreover, the display device provided with a TFT can be operated in low power consumption compared with a CRT. Furthermore, the display device provided with a TFT occupies small space, since a display can be made without using a large-sized display tube like a CRT. Thus, the display device provided with a TFT has been widely used for a display portion of a personal computer, a PDA, a TV, or the like.

A display device which is made thinner, lighter, and more flexible is required in future. However, most of conventional TFTs have been manufactured by using an inorganic semiconductor material such as amorphous silicon or crystalline silicon as a semiconductor film. Therefore, the use of a resin substrate such as a plastic is limited since a processing temperature of 350° C. or more is required for forming a semiconductor film in the case where a TFT is formed by using an inorganic semiconductor material.

In recent years, an organic thin film transistor (hereinafter, an organic TFT) in which an organic semiconductor is used as a semiconductor layer has been studied. An organic TFT has high flexibility since an organic material is used. Moreover, a device using an organic semiconductor can be manufactured at a lower temperature compared with a device using an inorganic semiconductor; thereby a resin material such as a plastic can be used for a substrate. As a result, a lightweight and flexible device can be obtained.

Moreover, as for an organic TFT, it is expected that not only can process such as a printing method, an ink jetting method, and a vapor deposition method be simplified, but a manufacturing cost of a device can be also suppressed since an inexpensive material for a substrate can be used, and thus it is advantageous in view of the cost.

Moreover, as for an organic TFT manufactured at present, a TFT element in which pentacene is laminated over an $SiO_2$/Si substrate in which only surface cleaning is carried out and over a substrate in which the surface is treated with HMDS after carrying out surface cleaning under the same condition is manufactured. (refer to Non-Patent Document 1: I. Yagi, K. Tsukagoshi, and Y. Aoyagi, "Pentacene FET fabricated on surface treated $SiO_2$/Si substrate", Proceedings of the $50^{th}$ Japan Society of Applied Physics Lectures (March 2003), lower section of p. 1418.)

According to the Non-Patent Document 1, as for an organic TFT in which a surface is not treated, preferable TFT characteristic can be obtained in mobility, ON-OFF ratio, or a threshold value only in the case of using an element in which a channel length is long or a channel width is wide.

However, in the case of manufacturing a device using an organic TFT, it is essential to develop an element in which a channel length is short or a channel width is narrow in order to downsize a device.

SUMMARY OF THE INVENTION

It is an object of the present invention to provide an organic TFT in which characteristic is improved by a method which is different from the above-mentioned Non-Patent Document 1.

Moreover, an organic semiconductor has a disadvantage in which an organic semiconductor is deteriorated due to moisture or atmospheric air in the case of being left in atmospheric air; and thus TFT characteristic is decreased. Furthermore, characteristic of an organic semiconductor element is influenced by the adhesion strength between an organic semiconductor film and an electrode, and between the organic semiconductor film and an insulating film.

In view of the foregoing problems, it is an object of the invention to provide a method for manufacturing an organic semiconductor element which can prevent TFT characteristic from deteriorating even if an element in which a channel length is short or a channel width is narrow.

One feature of the invention is that an element is heated (also referred to as "baked") after an organic semiconductor film is deposited.

One feature of a specific method for manufacturing an organic semiconductor element according to the invention includes the steps of forming an organic semiconductor film, and then heating the organic semiconductor film under atmospheric pressure or under reduced pressure.

One feature of a method for manufacturing an organic semiconductor element according to the invention includes the steps of forming a gate electrode, forming an organic semiconductor film over the gate electrode, then heating the organic semiconductor film under atmospheric pressure or under reduced pressure, and then forming a source electrode and a drain electrode over the heated organic semiconductor film.

One feature of a method for manufacturing an organic semiconductor element according to the invention includes the steps of forming a gate electrode, forming a source electrode and a drain electrode over the gate electrode, then forming an organic semiconductor film over the source electrode and the drain electrode, and then heating the organic semiconductor film under atmospheric pressure or under reduced pressure.

One feature of a method for manufacturing an organic semiconductor element according to the invention includes the steps of forming an organic semiconductor film to be in contact with an inorganic film, and then heating the organic semiconductor film under atmospheric pressure or under reduced pressure.

One feature of a method for manufacturing an organic semiconductor element according to the invention includes the steps of forming an organic semiconductor film to be in contact with a gate insulating film, and then heating the organic semiconductor film under atmospheric pressure or under reduced pressure.

According to the invention, an organic semiconductor film may be heated at a temperature which is less than the melting point of an organic semiconductor film material.

According to the invention, an organic semiconductor film may be heated at a temperature which is less than 250° C.

According to the invention, an organic semiconductor film may be heated at a temperature in which average value of the grain boundary (grain) size of the organic semiconductor film does not grow 10% or more.

As for the organic semiconductor element formed in the above-mentioned manner, a substrate formed by synthetic resin such as a plastic, an acryl or the like typified by polyethylene terephthalate (PET), polyethylene naphthalate (PEN), polyethersulfone (PES) can be used since heating temperature is low in manufacturing process.

The baking may be carried out either under atmospheric pressure or under reduced pressure; however, the baking temperature can be lowered under reduced pressure. Accordingly, it can be expected that the deterioration of the organic semiconductor element due to heating is reduced. Especially, the baking is preferably carried out at a low temperature in the case where synthetic resin is used for the substrate. Moreover, the baking may be carried out in an inert gas atmosphere.

The gate electrode, or the source electrode and the drain electrode can be formed by using a sputtering method, an ink-jetting method, a spin coating method, or a vapor deposition method. In addition, the gate electrode, or the source electrode and the drain electrode can be formed by an element selected from the group consisting of W, Ta, Ti, Mo, Al, and Cu; or an alloy material or a compound material in which at least one of the elements is used as a main component.

Furthermore, the organic semiconductor element formed in the above-mentioned manner can be obtained and the organic semiconductor element can be provided for a pixel portion of a liquid crystal display device or a display device having a light emitting element to use as a semiconductor element according to the invention. Especially, flexibility and lightweight of the liquid crystal display device or the display device having a light emitting element can be enhanced by providing the organic semiconductor element over synthetic resin.

According to the invention, a threshold value of ON-OFF can be changed and leakage current at OFF state can be reduced. Thus, the threshold value of ON-OFF can be made close to 0V to raise ON-OFF ratio. Accordingly, characteristic of the organic semiconductor element can be improved.

Moreover, due to the improvement, practicable TFT characteristic can be obtained even if an element in which a channel length is short and a channel width is narrow is used, and thus a device such as a display device can be downsized.

These and other objects, features and advantages of the invention will become more apparent upon reading of the following detailed description along with the accompanied drawings.

DETAILED DESCRIPTION OF THE INVENTION

Hereinafter, embodiment modes according to the present invention will be described in detail with reference to the drawings. However, the present invention can be carried out in many different modes, and it is easily understood by those who are skilled in the art that embodiments and details herein disclosed can be modified in various ways without departing from the purpose and the scope of the present invention. Therefore, it should be noted that the description of the embodiment modes to be given below should not be interpreted as being limited to the present invention. Further, in all of views for describing the embodiment modes, the similar portion or the portion which have the similar function is marked with the same reference number, and a repeated explanation thereof will be omitted.

Embodiment Mode 1

In this embodiment mode, a method for manufacturing an organic TFT is described as an organic semiconductor element of bottom contact type.

Figure 1:
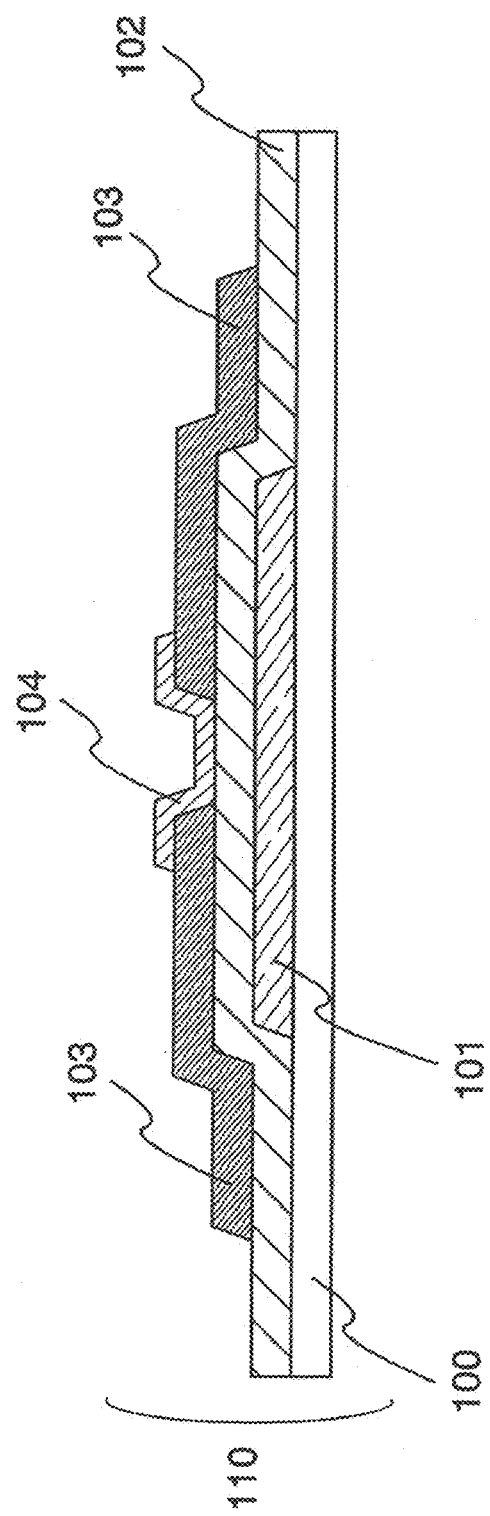
FIG. 1 is a cross-sectional view of an organic thin film transistor of bottom contact type according to the present invention.

FIG. 1 shows a cross-sectional view of an organic TFT of bottom contact type. The organic of bottom contact type has an element structure in which an organic semiconductor film is formed after a source electrode and a drain electrode are formed.

First, a conductive film (hereinafter, a gate electrode) 101 which serves as a gate electrode is formed over a substrate 100 having an insulating surface. Note that a method for manufacturing an organic TFT in this embodiment mode is illustrated with an example in which a quartz substrate is used for the substrate 100 having an insulating surface, tungsten (W) is used as the conductive film 101 over the quartz substrate, and the gate electrode is formed by a sputtering method, but the present invention is not limited to this.

As a substrate having an insulating surface, a glass substrate such as a barium borosilicate glass and an alumino borosilicate glass, or a stainless steel substrate or the like can be used. Moreover, it is preferable to use a substrate formed by synthetic resin such as a plastic or an acryl typified by polyethylene terephthalate (PET), polyethylene naphthalate (PEN), polyethersulfone (PES). A substrate formed by such synthetic resin is flexible and lightweight.

Moreover, a substrate is preferably used after polishing the surface by a chemical or mechanical polishing method, so called CMP (Chemical-Mechanical Polishing), to enhance planarity of the substrate. As a polishing agent (slurry) of CMP, a polishing agent in which fumed silica particles obtained by pyrolyzing a chloride silicon gas are dispersed into a KOH solution can be used.

If necessary, a base film may be formed over the substrate. The base film serves as to prevent an alkaline metal such as Na or an alkaline earth metal included in the substrate from dispersing into a semiconductor film; therefore, adverse effect on the characteristic of a semiconductor element is prevented. Therefore, the base film can be formed by using an insulating film such as silicon oxide, silicon nitride, silicon nitride oxide, titanium oxide, and titanium nitride which can prevent an alkaline metal or an alkaline earth metal from dispersing into the semiconductor film.

The gate electrode may be formed by an element selected from the group consisting of Ta, Ti, Mo, Al, and Cu; or an alloy material or a compound material in which at least one of the elements is used as a main component, in addition to tungsten. Moreover, the gate electrode can have a single layer structure or a laminated structure. Furthermore, the gate electrode may be formed by using a screen printing method, a roll coating method, a droplet discharge method, a spin coating method, a vapor deposition method, or the like. As a material for the electrode, a conductive high molecular weight compound or the like may be used, in addition to a metal and a metal compound.

A droplet discharge method is a method which can form a pattern selectively, and a method for forming a conductive film by selectively discharging (jetting) a droplet (also referred to as a dot) of a composition mixed with a material for a conductive film, an insulating film or the like. A droplet discharge method is also referred to as an ink-jetting method, depending on the system.

In the case where the conductive film is formed by using a droplet discharge method, a conductive material mixed with a solvent described hereinafter can be used: an element selected from the group consisting of gold (Au), silver (Ag), copper (Cu), platinum (Pt), palladium (Pd), tungsten (W), nickel (Ni), tantalum (Ta), bismuth (Bi), lead (Pb), indium (In), tin (Sn), zinc (Zn), titanium (Ti), or aluminum (Al), an alloy or a dispersion nanoparticle including at least one of the elements, or a fine particle of silver halide.

Moreover, in the case where the conductive film is formed by using a screen printing method or the like, a conductive paste in used. As the conductive paste, a conductive carbon paste, a conductive silver paste, a conductive copper paste, a conductive nickel, or the like can be used. After forming the conductive film in a predetermined pattern by the conductive paste, leveling and drying are carried out, and may be cured at temperatures of from 100 to 200° C.

After forming the gate electrode 101, an insulating film 102 (hereinafter, a gate insulating film) which serves as a gate insulating film is formed. Note that a TFT in this embodiment mode is described using an example in which the gate insulating film 102 is formed by depositing SiON by using a CVD method; however, the gate insulating film 102 may be formed by using a sputtering method, a spin coating method, a vapor deposition method or the like, in addition to a CVD method.

As a material for the gate insulating film 102, an organic or inorganic material such as silicon nitride oxide (SiON), silicon oxide ($SiO_2$), silicon nitride (SiN), siloxane, polysilazane, and polyvinyl alcohol, may be used. Siloxane is a material which has a skeleton constructed from the bond of silicon (Si) and oxygen (O), and is formed by using a polymer material as a starting material, which has a substituent including at least hydrogen or which has at least one selected from the group consisting of substituent including fluorine, alkyl group, and aromatic hydrocarbon group as a starting material. Polysilazane is formed by using a liquid material which includes a polymer material having the bond of silicon (Si) and nitride (Ni), a so-called polysilazane, as a starting material.

In addition, an insulating film obtained by anodizing the gate electrode may be used for an insulating film which is used as the gate insulating film 102.

Next, a conductive film 103 (hereinafter, a source electrode and a drain electrode) which serves as a source electrode and a drain electrode of a TFT is formed over the gate insulating film 102. Note that a TFT in this embodiment mode is described using an example in which tungsten is formed as the source electrode and the drain electrode 103 by using a sputtering method; however, the source electrode and the drain electrode 103 may be formed by using an ink jetting method, a spin coating method, a vapor deposition method or the like, in addition to a sputtering method. As a material for the source electrode and the drain electrode 103, a conductive high molecular weight material or the like may be used, in addition to a metal and a metal compound. In other words, the source electrode and the drain electrode 103 can be formed with reference to the material or the manufacturing method of the gate electrode 101.

However, the source electrode and the drain electrode 103 need to form an ohmic contact with an organic semiconductor film. Therefore, in the case where an organic semiconductor material is p-type, it is preferably to use a material having a higher work function than an ionization potential of an organic semiconductor material, and in the case where an organic semiconductor material is n-type, it is preferably to use a material having a lower work function than an ionization potential of an organic semiconductor material. In this embodiment mode, pentacene which is a p-type organic semiconductor material is used, so tungsten having comparatively a high work function is used.

Next, an organic semiconductor film 104 is formed over the insulating film 102, source electrode 103, and drain electrode 103. Note that in this embodiment mode, an example in which pentacene is used as an organic semiconductor material is described, but as the organic semiconductor material, an organic molecular crystal or an organic high molecular weight compound may be used. As a specific organic molecular crystal, a polycyclic aromatic compound, a conjugated double bond system compound, carotene, a macrocyclic compound and a complex thereof, phthalocyanine, diphenylpycrylhydrazyl, a charge transfer type complex (a CT complex), a dye, a protein or the like can be given. For example, anthracene, tetracene, pentacene, 6T (hexathiophene), TCNQ (tetracyanoquinodimethane), a perylenetetracarboxylic derivative such as PTCDA, a naphthalene tetracarboxylic derivative such as NTCDA, or the like can be given. On the other hand, as a specific organic high molecular weight compound material, a p-conjugated polymer, a carbon nanotube, polyvinilpyridine, a phthalocyanine metal complex, a phthalocyanine metal complex, iodide complex or the like can be given. Specially, it is preferable to use a p-conjugated polymer having a skeleton constituted by a conjugated double bond such as polyacetyrene, polyaniline, polypyrrole, polythienylene, polythiophene derivatives, poly (3-alkylthiophene), polyparaphenylene derivatives, or polyparaphenylene vinylene derivatives.

As a method for forming a film, a method which can form a film having an even film thickness may be employed. As a specific method, a vapor deposition method, a spin coating method, a bar-code method, a solution cast method, a dipping method, or the like may be employed.

As pretreatment for forming an organic semiconductor film, plasma treatment may be performed to a surface to be formed, or a film, for example a self-assembled monolayer (SAM) and an alignment film, may be formed to enhance adhesion strength or the condition of the interface.

Note that in this embodiment mode, pentacene which is an organic material is scattered by a vacuum vapor deposition method to form the organic semiconductor film 104 over the gate insulating film 102 and the source and drain electrodes 103.

Next, the element substrate 110 is baked after forming the organic semiconductor film 104. At this time, the temperature is set to be less than the temperature in which the organic semiconductor film 104 is evaporated or decomposed. A temperature as high as possible within the range is effective for improving organic TFT characteristic. In addition, the temperature at this time is desirably the melting point of the organic semiconductor film 104 or less. As one of the causes of improving the TFT characteristic by performing baking, it is speculated that carrier transportability is improved since the adhesion strength between the organic semiconductor film 104, and the source electrode and drain electrode 103 and the insulating film 102 is enhanced by baking; and therefore, an injection barrier becomes decreased. Moreover, it is speculated that a high temperature is effective for improving TFT characteristic to enhance the adhesion strength between the organic semiconductor film 104, and the source electrode and drain electrode 103 and the insulating film 102. Furthermore, it is speculated that the TFT characteristic is improved compared with before baking since moisture in the organic semiconductor film 104 is decreased by performing baking; and therefore, the deterioration of the organic semiconductor film 104 can be suppressed.

With reference to a result of before and after baking using pentacene as an organic semiconductor material as shown in embodiment 6, the temperature during baking is preferably set at a temperature in which grain boundary (grain) of pentacene does not grow before and after baking.

With reference to a result of baking under atmospheric pressure using pentacene as an organic semiconductor material as shown in embodiment 1, the shift of a threshold value becomes smaller as a temperature becomes gradually high to 120° C., 150° C. and 200° C. In other words, it is understood that a high temperature is effective for improving the organic TFT characteristic. Moreover, according to embodiment 1, in the case where pentacene is used as the organic semiconductor material, it is understood that a temperature of approximately 250° C. is the temperature of being evaporated or decomposed. Therefore, heating temperature is preferably less than 250° C. It is speculated that the TFT characteristic is improved since carrier transportability is improved by enhancing the adhesion strength between the organic semiconductor film 104 and the source electrode and the drain electrode 103 and the insulating film 102 by performing baking; and therefore, an injection barrier becomes small. Moreover, it is speculated that a higher temperature is furthermore effective for improving the TFT characteristic, since the adhesion strength between the organic semiconductor film 104 and the source electrode and the drain electrode 103 and the insulating film 102 is enhanced. It is also speculated that the TFT characteristic is improved compared with before baking since moisture in the organic semiconductor film 104 is decreased by performing baking; and therefore, the deterioration of the organic semiconductor film 104 can be suppressed.

As for the atmosphere during baking, inert gas atmosphere such as nitrogen or argon may be employed in consideration of deterioration of the organic semiconductor film due to oxygen or moisture, even though an effect can be also expected in atmospheric air. Moreover, the baking may be also carried out under reduced pressure (for example, from $1.3*10^{-3}$ Pa to $6.7*10^4$ Pa) to suppress a deterioration of the organic semiconductor film and make baking temperature low.

With reference to a result of baking under reduced pressure ($1.2*10^4$ Pa) using pentacene as an organic semiconductor material as shown in embodiment 3, the baking performed under reduced pressure may be more effective compared with the baking under atmospheric pressure, in the case where the baking is carried out at same temperature (120° C. and 150° C.). Moreover, it is understood that the effect of the baking can be obtained at a lower temperature by carrying out the baking under reduced pressure. It is speculated that a TFT characteristic is improved by performing baking under reduced pressure, since deterioration such as oxidation of the organic semiconductor film due to oxygen in atmospheric air is suppressed.

In addition, the baking may be carried out under atmospheric pressure or under reduced pressure after being left under atmospheric pressure after deposition. In addition, reduced pressure may be kept after deposition to carry out the baking. In other words, the organic semiconductor film may be heated in a processing chamber in which the organic semiconductor film is formed.

Embodiment 4 shows a result of baking which is carried out under reduced pressure after once being left under atmospheric pressure is shown, and Embodiment 5 shows a result of baking which is carried out under reduced pressure after deposition. It is understood that an effect of the baking is obtained in the both cases.

Furthermore, it is understood according to embodiment 4 that an organic TFT characteristic is recovered by performing baking after once being left under atmospheric pressure.

As described above, according to the present invention, it is understood that an organic TFT characteristic is improved by performing baking after an organic semiconductor film is formed. It is speculated that the TFT characteristic is improved since moisture in the organic semiconductor film is reduced by performing baking; and therefore, a deterioration of the organic semiconductor film is suppressed. It is also speculated that the adhesion strength between the electrode and the insulating film, and the organic semiconductor film is enhanced by baking, and the crystallinity of the organic semiconductor film and carrier transportability are improved; therefore, the TFT characteristics are improved compared with before baking. As for the baking under reduced pressure, it is speculated that the TFT characteristic is improved since a deterioration of the organic semiconductor film due to oxygen in atmospheric air is suppressed.

Thus, an organic TFT of bottom contact type is completed.

The organic TFT described above can be utilized as a switching element of a liquid crystal display device. For example, a liquid crystal display device can be manufactured by forming a pixel electrode (ITO or a metal film) over either a source electrode or a drain electrode and by providing with a liquid crystal layer. Moreover, an organic TFT according to the present invention may be utilized for such as a switching element of a display device having a light emitting element or the like.

Embodiment Mode 2

Figure 2:
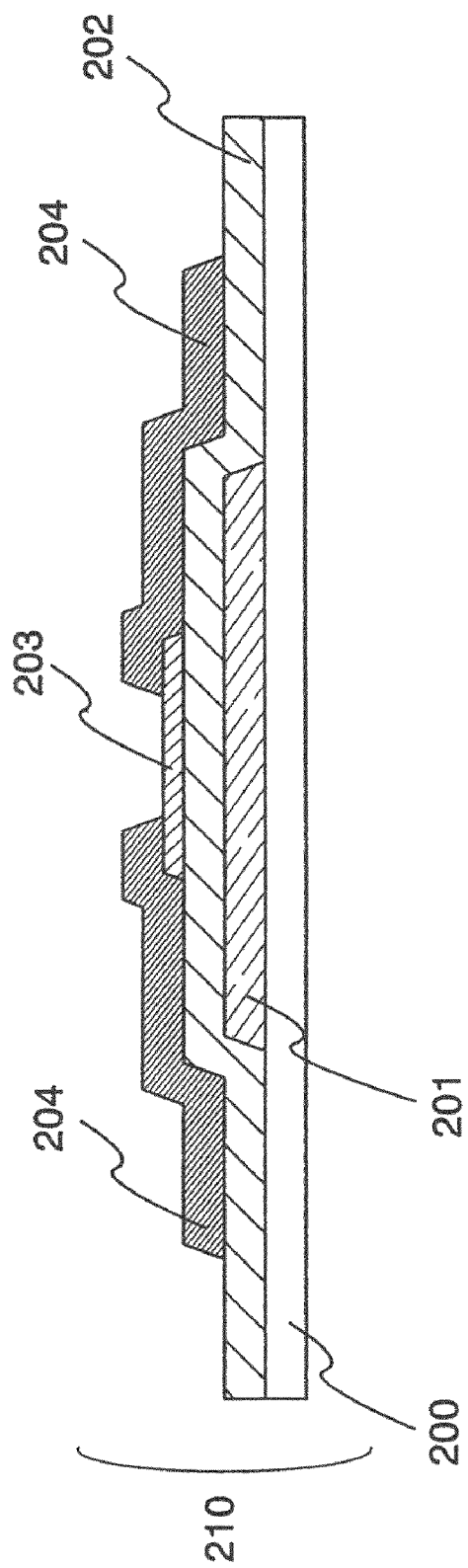
FIG. 2 is a cross-sectional view of an organic thin film transistor of top contact type according to the invention.

In this embodiment mode, an organic TFT of top contact type in which a source electrode and a drain electrode are formed after forming an organic semiconductor film, which is different from Embodiment Mode 1, is described with reference to FIG. 2.

First, as in Embodiment Mode 1, an element substrate 210 in which a gate electrode 201 is formed over a substrate 200 and a gate insulating film 202 provided to cover the gate electrode is formed is prepared. A material of the gate electrode and the gate insulating film or a method for manufacturing thereof can be referred to Embodiment Mode 1.

Next, an organic semiconductor film 203 is formed over the element substrate 210. As the organic semiconductor material, an organic molecular crystal or an organic high molecular weight compound may be used. As a specific organic molecular crystal, a polycyclic aromatic compound, a conjugated double bond system compound, carotene, a macrocyclic compound and a complex thereof, phthalocyanine, diphenyl-pycrylhydrazyl, a charge transfer type complex (a CT complex), a dye, a protein or the like can be given. For example, anthracene, tetracene, pentacene, 6T (hexathiophene), TCNQ (tetracyanoquinodimethane), a perylenetetracarboxylic derivative such as PTCDA, a naphthalene tetracarboxylic derivative such as NTCDA, or the like can be given. On the other hand, as a specific organic high molecular weight compound material, a p-conjugated polymer, a carbon nanotube, polyvinilpyridine, a phthalocyanine metal complex, a phthalocyanine metal complex, iodide complex or the like can be given. Specially, it is preferable to use a p-conjugated polymer having a skeleton constituted by a conjugated double bond such as polyacetyrene, polyaniline, polypyrrole, polythienylene, polythiophene derivatives, poly (3-alkylthiophene), polyparaphenylene derivatives, or polyparaphenylene vinylene derivatives.

Moreover, as a method for forming a film, a method in which a film having an even film thickness can be formed over the element substrate 210 may be employed. As a specific method, a vapor deposition method, a spin coating method, a bar-code method, a solution cast method, a dipping method, or the like may be employed.

As pretreatment for forming an organic semiconductor film 203, plasma treatment may be performed to a surface to be formed, or a film to enhance adhesion strength or condition of the interface for example a self-assembled monolayer (SAM) and an alignment film may be formed.

Subsequently, an electrode that serves as a source electrode 204 and a drain electrode 204 of the TFT are formed. A material of the source electrode 204 and the drain electrode 204 may refer to Embodiment Mode 1.

The source electrode 204 and the drain electrode 204 need to form ohmic contact to with an organic semiconductor film 203. Therefore, in the case where an organic semiconductor material is p-type, it is preferable to use a material having a higher work function than ionization potential of an organic semiconductor material, and in the case where an organic semiconductor material is n-type, it is preferable to use a material having a lower work function than ionization potential of an organic semiconductor material. In addition, as a method for forming a film, a method which can form a film having an even film thickness over the element substrate 210 may be employed. A specific method may refer to Embodiment Mode 1.

Next, the element substrate 210 is baked after forming the source electrode 204 and the drain electrode 204. At this time, a temperature is set to be less than the temperature in which the organic semiconductor film is evaporated or decomposed. Moreover, a temperature which is as high as possible within the range of the melting point or less is effective for improving the organic TFT characteristic. Moreover, baking may be performed before forming the source electrode 204 and the drain electrode 204 and after forming the organic semiconductor film 203.

As for the atmosphere during the baking, inert gas atmosphere such as nitrogen or argon may be employed in consideration of deterioration of the organic semiconductor film due to oxygen or moisture, even though an effect can be also expected when baking is performed under atmospheric pressure. Moreover, the baking may be carried out under reduced pressure (for example, from $1.3*10^{-3}$ Pa to $6.7*10^4$ Pa) to suppress a deterioration of the organic semiconductor film and make baking temperature lower, as described above.

Thus, an organic TFT of top contact type is completed.

The organic TFT described above can be utilized as a switching element of a liquid crystal display device. For example, a liquid crystal display device can be manufactured by forming a pixel electrode (ITO or a metal film) on either a source electrode or a drain electrode and by providing with a liquid crystal layer. Moreover, an organic TFT according to the invention may be utilized for such a switching element of a display device having a light emitting element and the like.

Embodiment 1

Figure 3:
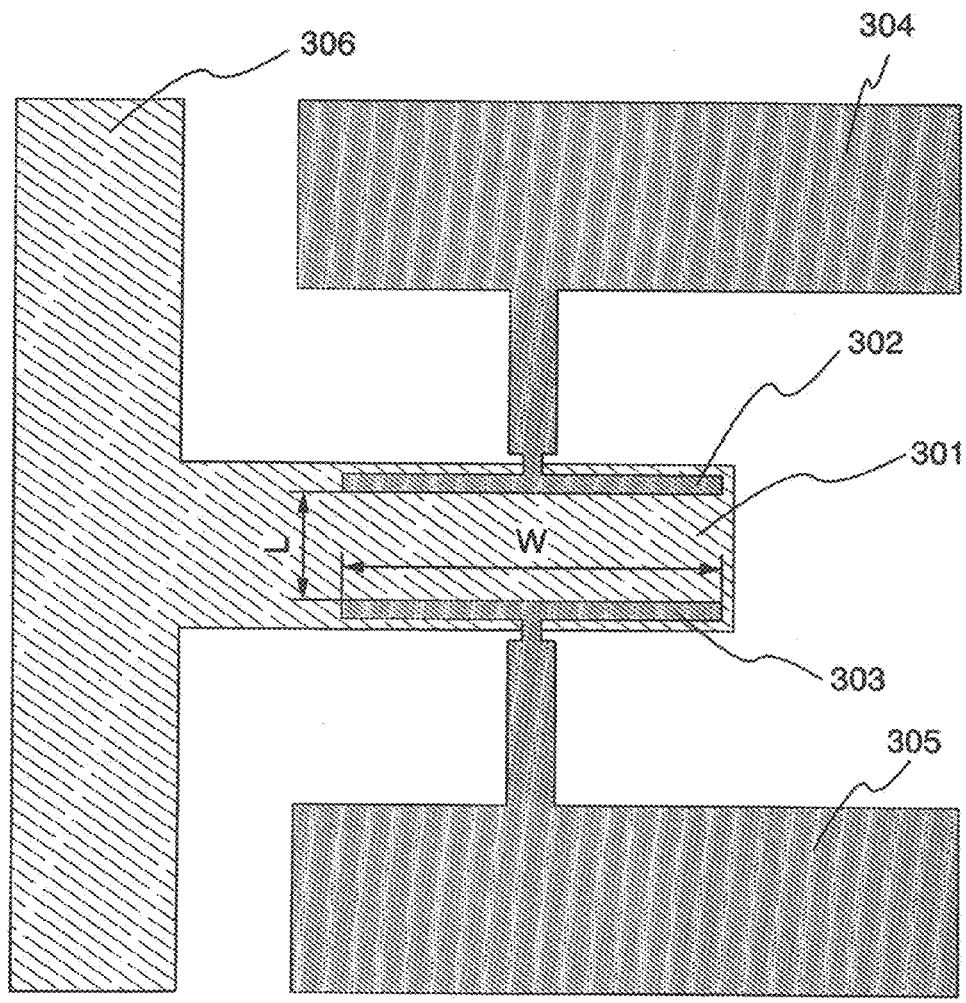
FIG. 3 shows a diagram showing an arrangement of an electrode according to the invention.

In this embodiment, a result which is temperature dependence of electric properties of the organic TFT manufactured by performing baking under atmospheric pressure according to the above-mentioned Embodiment Mode 1 is shown. Note that the organic TFT used as a test sample has a structure in which a gate electrode 301 formed by tungsten is provided over a quartz substrate, a gate insulating film is provided over the gate electrode 301, a source electrode 302 and a drain electrode 303 formed by tungsten are provided over the gate insulating film, and an organic semiconductor film is provided between the source electrode 302 and the drain electrode 303, in atmospheric air as shown FIG. 3. Moreover, the source electrode 302, the drain electrode 303 and the gate electrode 301 is each provided with a measuring pad (a pad 304 for the source electrode, a pad 305 for the drain electrode, a pad 306 for the gate electrode) to apply measurement voltage or to detect current.

In addition, a channel length of the organic TFT corresponds to the length between the source electrode and the drain electrode (referred to as L in FIG. 3), and the value of L is 5 μm. On the other hand, a channel width of the organic TFT corresponds to the length of the region where the source electrode and the drain electrode are overlapped with each other (referred to as W in FIG. 3), and the value of W is 8000 μm.

Pentacene was used as a material for the organic semiconductor, and the organic semiconductor was formed to be 50 nm thick. As a film formation method, a vapor deposition method was used.

The baking condition after deposition is as follows:
(1) Not baked
(2) Baked for 10 minutes at a temperature of 120° C. under atmospheric pressure
(3) Baked for 10 minutes at a temperature of 150° C. under atmospheric pressure
(4) Baked for 10 minutes at a temperature of 200° C. under atmospheric pressure
(5) Baked for 10 minutes at a temperature of 250° C. under atmospheric pressure FIG. 4 shows a result of Vg-Id characteristic in which the current of the drain electrode and a gate voltage are detected when voltage of −10V is applied as Vd in the baking condition (1) through (5).

Figure 4:
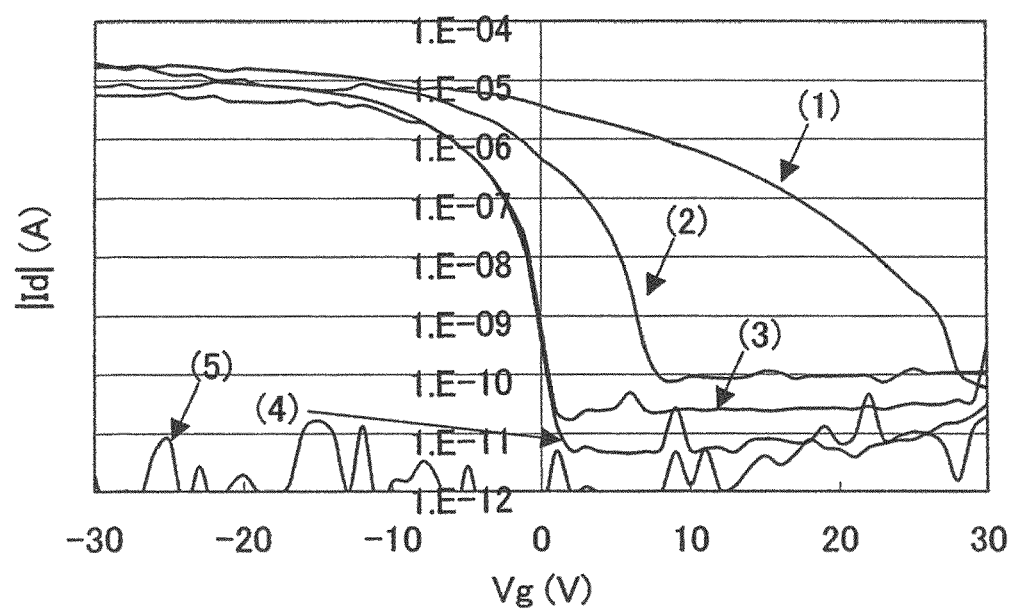
FIG. 4 shows a graph showing an experimental result according to the invention.

FIG. 4 shows that a threshold value of ON-OFF approaches 0V by performing baking after deposition. Under atmospheric pressure, a threshold value in the case where baking is carried out for 10 minutes at a temperature of 150° C. (3) shifts significantly than a threshold value in the case where baking is carried out for 10 minutes at a temperature of 120° C. (2). On the other hand, the case of 150° C. (3) and 200° C. (4) has few differences. FIG. 4 also shows that leakage current at OFF is decreased by performing baking after deposition. It is also understood that the case of 10 minutes at 150° C. (3) shifts more compared with the case of 10 minutes at 120° C. (2), and the case of 10 minutes at 200° C. (4) shifts more compared with the case of 10 minutes at 150° C. (3). Accordingly, it is speculated that the TFT characteristic is improved compared with before baking since moisture in the organic semiconductor film is decreased by performing baking; and therefore, the deterioration of the organic semiconductor film can be suppressed. It is also speculated that the adhesion strength between the electrode and the insulating film, and the organic semiconductor film is enhanced by baking, and the crystallinity of the organic semiconductor film and carrier transportability are improved; therefore, the TFT characteristic is improved compared with before performing baking. Furthermore, it is speculated that high temperature is effective for improving the TFT characteristic to enhance the adhesion strength between the organic material and both the source and drain electrodes 304 and the insulating film.

As described above, it can be understood that baking after deposition is effective to improve the organic TFT characteristic.

In addition, it seems that there is no improvement of the organic TFT characteristic in the case where baking is carried out at a temperature of 250° C. for 10 minutes (5). It can be considered that the organic TFT characteristic is disappeared due to thermal decomposition or oxidization of pentacene at a temperature of approximately 250° C. Therefore, it is understood that heat temperature is preferably set to be less than 250° C. in the case where pentacene is used as a material for the organic semiconductor material.

Embodiment 2

In this embodiment, a result which is time dependence of electric properties of the organic TFT manufactured by performing baking under atmospheric pressure according to the above-mentioned Embodiment Mode 1 is shown. Note that a manufacturing condition of the organic TFT, other than the baking condition after deposition, used as a test sample is the same as in Embodiment 1.

The baking condition after deposition is as follows:
(1) Before baking after deposition
(2) Baking (1) at a temperature of 120° C. for 10 minutes under atmospheric pressure
(3) Baking (2) at a temperature of 120° C. for 30 minutes under atmospheric pressure FIG. 5 shows a result of Vg-Id characteristic in which the current of the drain electrode and gate voltage are detected when voltage of −10V is applied as Vd in the baking condition (1) through (3).

Figure 5:
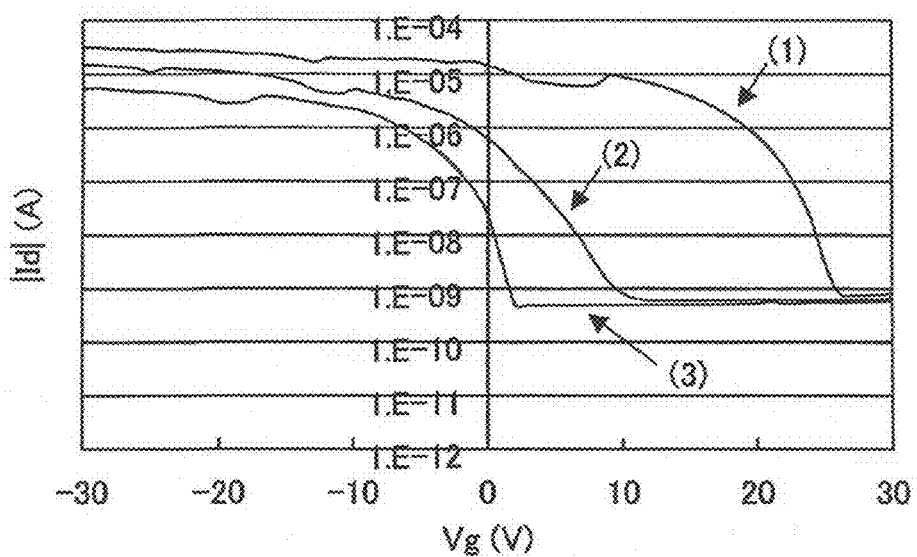
FIG. 5 shows a graph showing an experimental result according to the invention.

FIG. 5 shows that a threshold value of ON-OFF approaches 0V by performing baking after deposition, and shifts significantly when the baking time is long. Accordingly, it is speculated that the TFT characteristic is improved compared with before baking since moisture in the organic semiconductor film is decreased by performing baking; and therefore, the deterioration of the organic semiconductor film can be suppressed. It is also speculated that the adhesion strength between the electrode and the insulating film, and the organic semiconductor film is enhanced by baking, and the crystallinity of the organic semiconductor film and carrier transportability are improved; therefore, the TFT characteristic is improved compared with before performing baking. Furthermore, it is speculated that reducing of moisture in the organic semiconductor film and enhancing the adhesion strength between the organic semiconductor film and both of the source and drain electrodes and the insulating film are promoted by performing baking for a long time, and thus it is effective for improving characteristic of the organic semiconductor.

Accordingly, it is understood that baking after deposition is effective to improve the organic TFT characteristic.

Embodiment 3

In this embodiment, a result which is temperature dependence of electric properties of the organic 114 manufactured by performing baking under reduced pressure ($1.2*10^4$ Pa) after once being left under atmospheric pressure after deposition according to the above-mentioned Embodiment Mode 1 is shown. Note that a manufacturing condition of the organic TFT used as a test sample is the same as in Embodiment 1, other than the baking condition after deposition.

The baking condition is as follows:
(1) Baked for 10 minutes at a temperature of 120° C. under reduced pressure ($1.2*10^4$ Pa)
(2) Baked for 10 minutes at a temperature of 150° C. under reduced pressure ($1.2*10^4$ Pa)
(3) Baked for 10 minutes at a temperature of 200° C. under reduced pressure ($1.2*10^4$ Pa)

Figure 6:
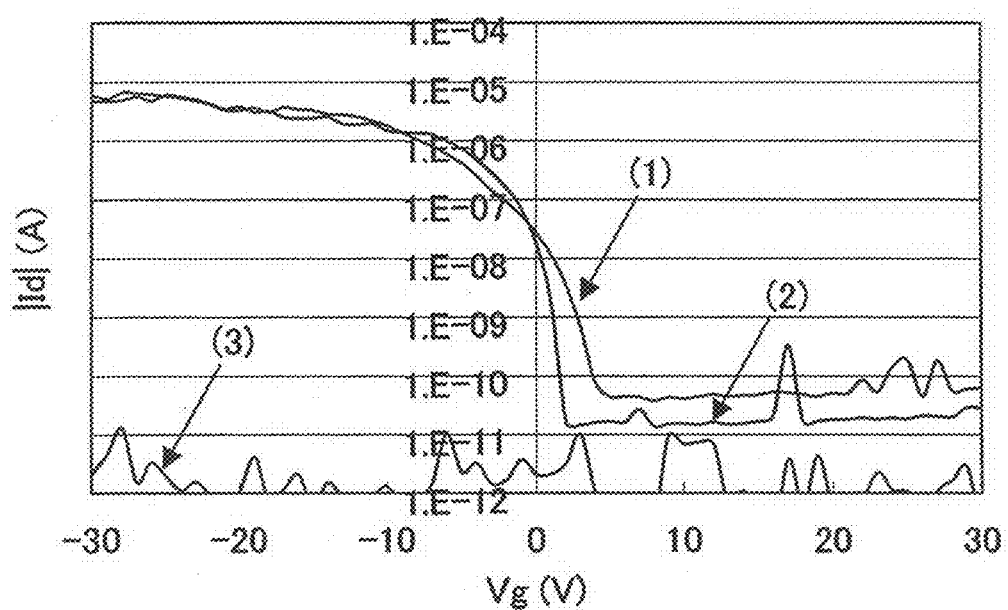
FIG. 6 shows a graph showing an experimental result according to the invention.

FIG. 6 shows a result of Vg-Id characteristic in which the current of the drain electrode and gate voltage are detected when voltage of −10V is applied as Vd in the baking condition (1) through (3).

FIG. 6 shows that a threshold value of ON-OFF approaches 0V by performing baking after deposition. Under reduced pressure ($1.2*10^4$ Pa), a threshold value in the case where baking is carried out for 10 minutes at a temperature of 150° C. (2) shifts significantly than a threshold value in the case where baking is carried out for 10 minutes at a temperature of 120° C. (1). FIG. 6 also shows that leakage current at OFF is decreased by performing baking after deposition. From seeing the decrease, it is also shown that the case of 10 minutes and 150° C. (2) shifts more than the case of 10 minutes and 120° C. (1). Furthermore, it can be understood that a preferable S value (subthreshold value) is obtained, since the beginning of a slope is steeper than the case where baking is carried out under atmospheric pressure according to the Embodiment 1. Accordingly, as well as in Embodiment 1, it is speculated that the TFT characteristic is improved compared with before baking since moisture in the organic semiconductor film is decreased by performing baking; and therefore, the deterioration of the organic semiconductor film can be suppressed. It is also speculated that the adhesion strength between the source and drain electrodes and the insulating film, and the organic semiconductor film is enhanced by baking, and the crystallinity of the organic semiconductor film and carrier transportability are improved; therefore, the TFT characteristic is improved compared with before performing baking. Furthermore, it is speculated that a higher temperature is more effective to improve the TFT characteristic since the adhesion strength between the organic material and both the source and drain electrodes and the insulating film is improved. In addition, it is speculated that high temperature gives high effect for improving the TFT characteristic to enhance the adhesion strength between the organic material and both the electrodes and the insulating film. Moreover, in this embodiment, it is speculated that the TFT characteristic is improved by performing baking under reduced pressure since the deterioration such as oxidation of the organic semiconductor film due to oxygen in atmospheric air is suppressed, compared with the baking under atmospheric pressure.

Accordingly, it can be understood that baking after deposition is effective to improve the organic TFT characteristic.

Further, when baking is performed under reduced pressure, baking temperature can be made lower.

Embodiment 4

According to the above-mentioned Embodiment Mode 1, a change over time in electric properties due to being left under atmospheric pressure of an organic TFT, which is manufactured by performing baking under reduced pressure ($1.2*10^4$ Pa) after once being left under atmospheric air after deposition was evaluated in this embodiment. The effect of subsequent baking under reduced pressure ($1.2*10^4$ Pa) is also evaluated in this embodiment mode. Hereinafter, the results are shown. Note that a manufacturing condition of the organic TFT used as a test sample, other than the baking condition after deposition, is the same as in Embodiment 1.

The baking condition is as follows:
(1) Baking for 30 minutes at a temperature of 150° C. under reduced pressure ($1.2*10^4$ Pa)
(2) Being left (1) for 48 hours under atmospheric air
(3) Baking (2) for 30 minutes at a temperature of 150° C. under reduced pressure ($1.2*10^4$ Pa)

Figure 7:
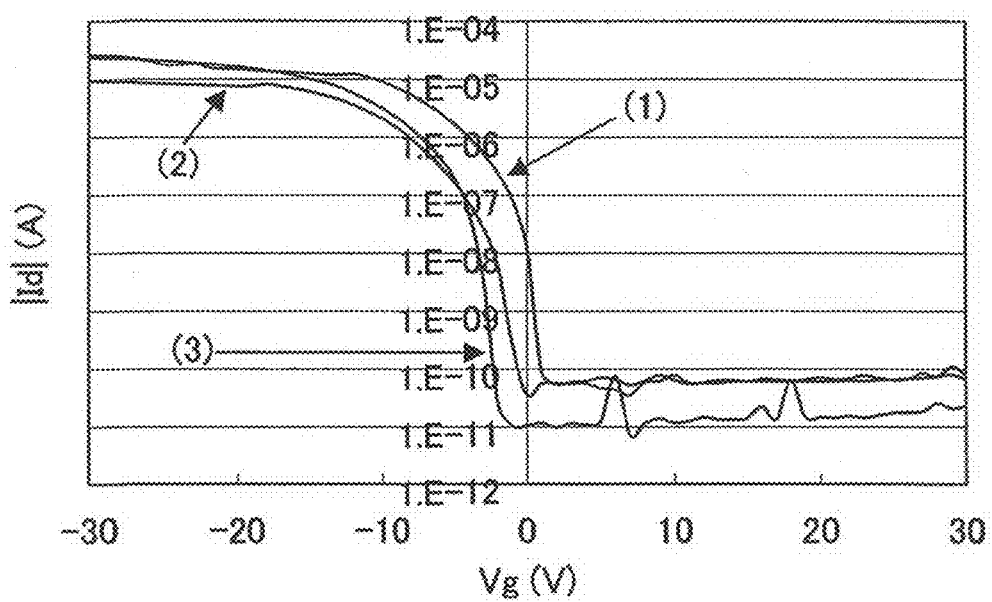
FIG. 7 shows a graph showing an experimental result according to the invention.

FIG. 7 shows a result of the Vg-Id characteristic in which the current of the drain electrode and a gate voltage are detected when voltage of −10V is applied as Vd in the baking condition (1) through (3).

FIG. 7 shows that a threshold value of ON-OFF approaches 0V by performing baking after deposition (1), and the ON current is decreased by being left for 48 hours under atmospheric air (2); and thus the characteristic is deteriorated. FIG. 7 also shows that the ON current is increased by performing baking again thereafter (3); and thus the organic TFT characteristic is improved. As well as in Embodiment 4, it is speculated that the TFT characteristic is improved since moisture in the organic semiconductor film is reduced by performing baking; and therefore, the deterioration of the organic semiconductor film is suppressed. It is also speculated that the adhesion strength between the source and drain electrodes and the insulating film, and the organic semiconductor film is enhanced by baking, and the crystallinity of the organic semiconductor film and carrier transportability are improved; therefore, the TFT characteristic is improved compared with before performing baking. Furthermore, it is speculated that the TFT characteristic is improved since the deterioration such as oxidation of the organic semiconductor film due to oxygen in atmospheric air is suppressed by performing baking under reduced pressure.

Accordingly, it can be understood that baking after deposition is effective to recover the deterioration of the organic TFT characteristic by being left under atmospheric pressure.

Embodiment 5

In this embodiment, a result which is electric properties of an organic TFT manufactured by performing baking in a deposition chamber immediately after deposition according to the above-mentioned Embodiment Mode 1 is shown. Note that a manufacturing condition of the organic used as a test sample, other than the baking condition after deposition, is the same as in Embodiment 1.

As for the baking condition after deposition, baking was carried out under reduced pressure ($1.3*10^{-3}$ Pa) that is the same at the time of depositing, since the baking is carried out in the deposition chamber. The baking condition is as follows:
(1) Not baked
(2) Baked at a temperature of 120° C. for 10 minutes FIG. 8 shows a result in which the Vg-Id characteristic in which the current of the drain electrode and the gate voltage are detected when a voltage of −10V is applied as Vd in the baking condition (1) and (2).

Figure 8:
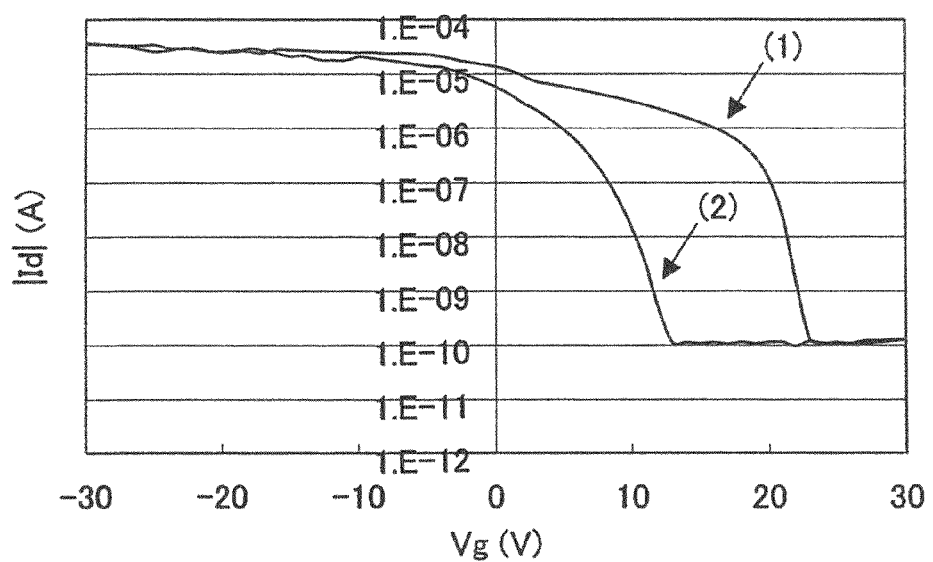
FIG. 8 shows a graph showing an experimental result according to the invention.

FIG. 8 shows that a threshold value of ON-OFF approaches 0V by performing baking after deposition in the deposition chamber; and thus the TFT characteristic is improved. It is speculated that the TFT characteristic is improved compared with before baking since moisture in the organic semiconductor film is decreased by performing baking; and therefore, the deterioration of the organic semiconductor film can be suppressed. It is also speculated that the adhesion strength between the source and drain electrodes and the insulating film, and the organic semiconductor film is enhanced by baking, and the crystallinity of the organic semiconductor film and carrier transportability are improved; therefore, the TFT characteristic is improved compared with before performing baking.

Accordingly, it can be understood that baking after deposition in the deposition chamber is effective to improve the organic TFT characteristic.

Embodiment 6

In this embodiment, a result in which a change of the grain boundary (grain) of pentacene and film thickness of an organic layer by performing baking after deposition are detected with AFM is shown. Note that as for a test sample, pentacene was deposited to have a film thickness of 50 nm over a substrate that is the same as in Embodiment 1. As for a film formation method, a vapor deposition method was employed.

The condition of the test portion is as follows:
(1) Not baked after deposition
(2) Baked at a temperature of 150° C. for 10 minutes under reduced pressure ($1.2*10^4$ Pa) after deposition FIG. 9 shows a measurement result with AFM according to the condition (1), and FIG. 10 shows a measurement result with AFM according to the condition (2).

Figure 9:
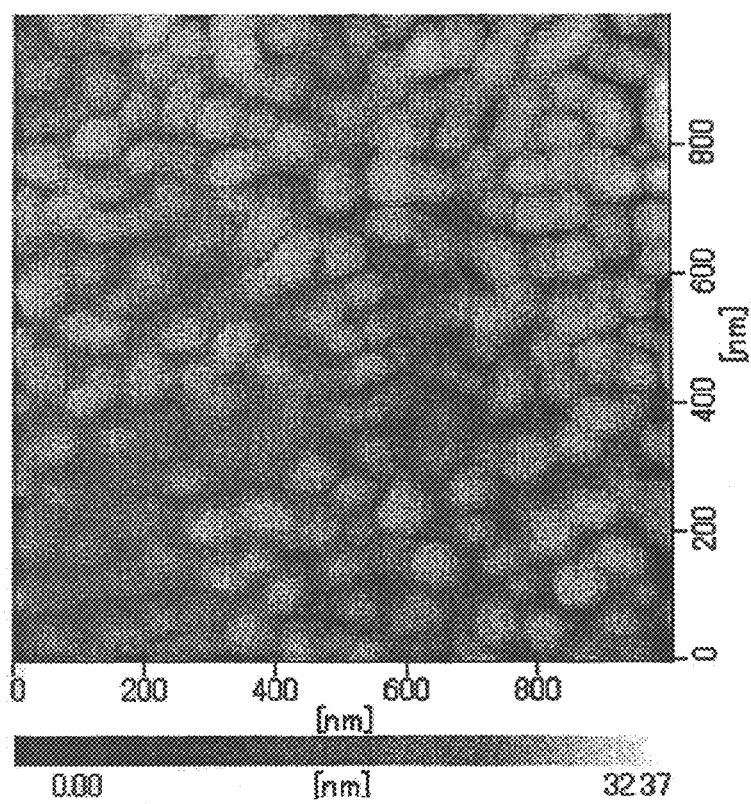
FIG. 9 shows an AFM view showing an experimental result according to the invention.
Figure 10:
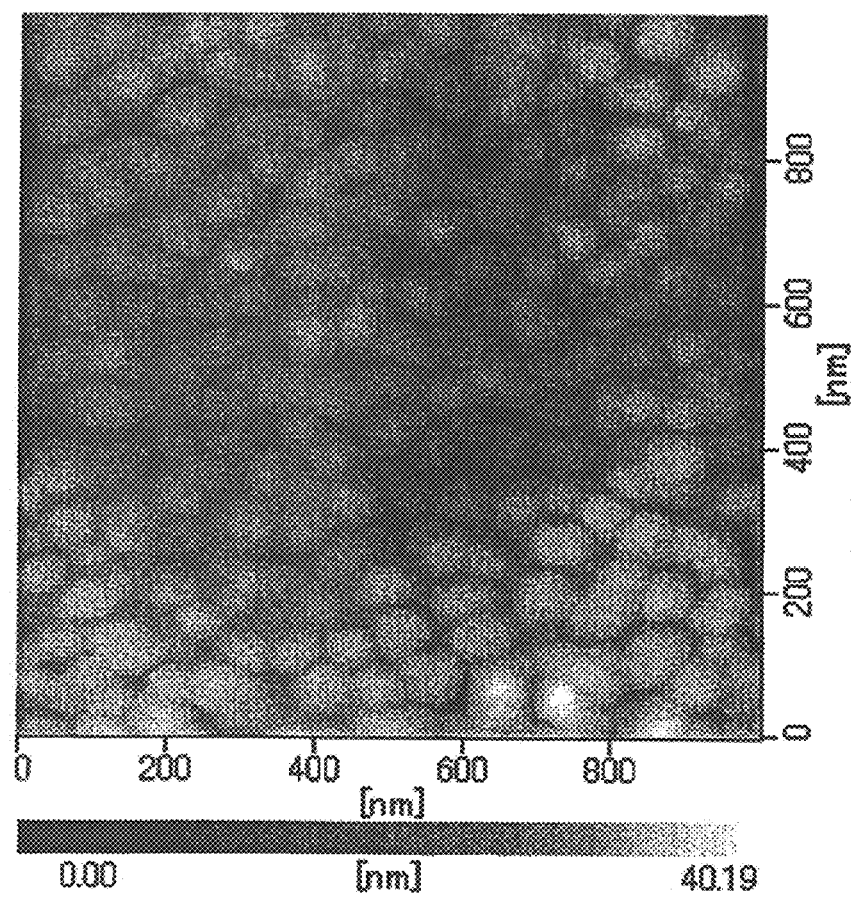
FIG. 10 shows an AFM view showing an experimental result according to the invention.

FIGS. 9 and 10 show that the grain boundary (grain) size of pentacene does not change whether baking is carried out after deposition or not. In addition, the film thickness of the organic film does not change at this time.

According to the above-mentioned results, it is understood that a preferable heating temperature after the organic semiconductor film is formed is a temperature in which crystal growth does not happen in the organic semiconductor, preferably, a temperature in which average value of the growth of grain boundary (grain) size of the organic semiconductor film is not 10% or more.

Embodiment Mode 3

A mode of a liquid crystal device including the semiconductor device according to the present invention is described with reference to FIG. 11. Note that a structure of the liquid crystal device is not limited in particular, and for example, a liquid crystal device in which a drive circuit is provided for an element substrate may be preferable, in addition to the mode shown in this embodiment mode. Moreover, this embodiment is not limited to the liquid crystal, and an organic semiconductor device according to the invention may be employed for a switching element and the like of a display device having a light emitting element.

Figure 11:
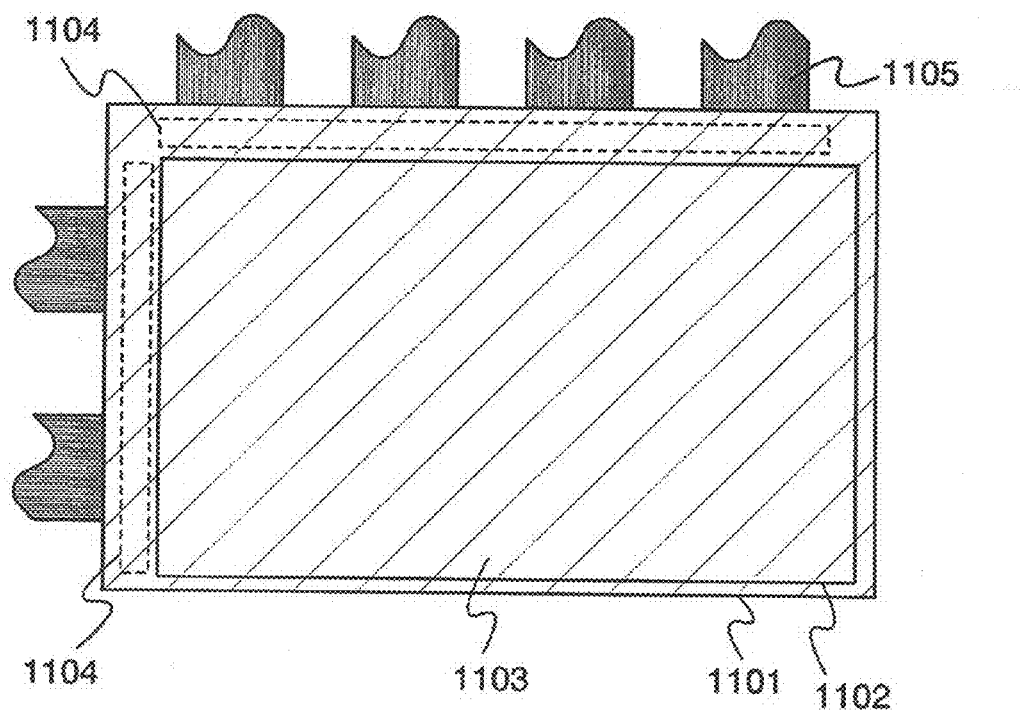
FIG. 11 is a top view of a liquid crystal device including a semiconductor device according to the invention.

FIG. 11 is a top view for schematically showing a liquid crystal device. The liquid crystal device according to this embodiment has a structure in which an element substrate 1101 is attached to an opposing substrate 1102 so as to face each other. The liquid crystal device according to this embodiment includes a pixel portion 1103. A terminal portion 1104 provided along one edge of the pixel portion 1103 is provided with a flexible printed circuit (FPC) 1105, and a signal is inputted from a drive circuit to the pixel portion 1103 via the flexible printed circuit 1105. Note that the drive circuit and the flexible printed circuit may be provided separately, or may be provided in complex with each other such as TCP in which an IC chip is mounted over the FPC in which a wiring pattern is formed.

Figure 12A:
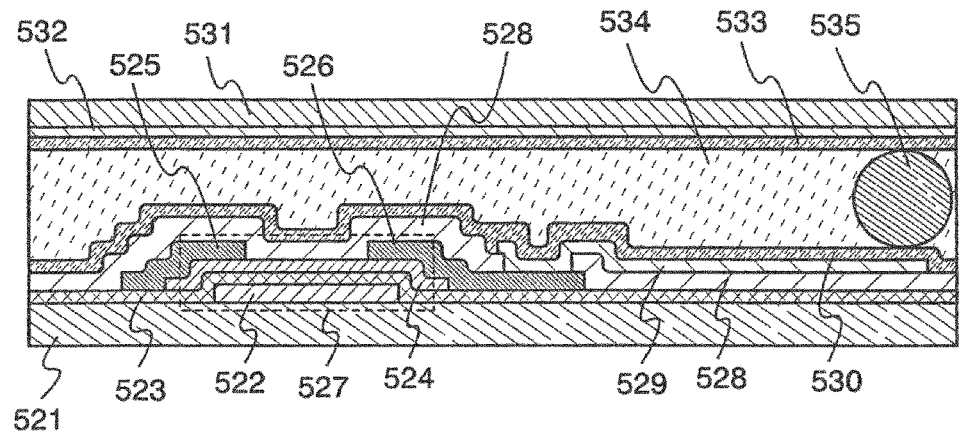
FIGS. 12A and 12B are cross-sectional views of a liquid crystal device including a semiconductor device according to the invention.
Figure 12B:
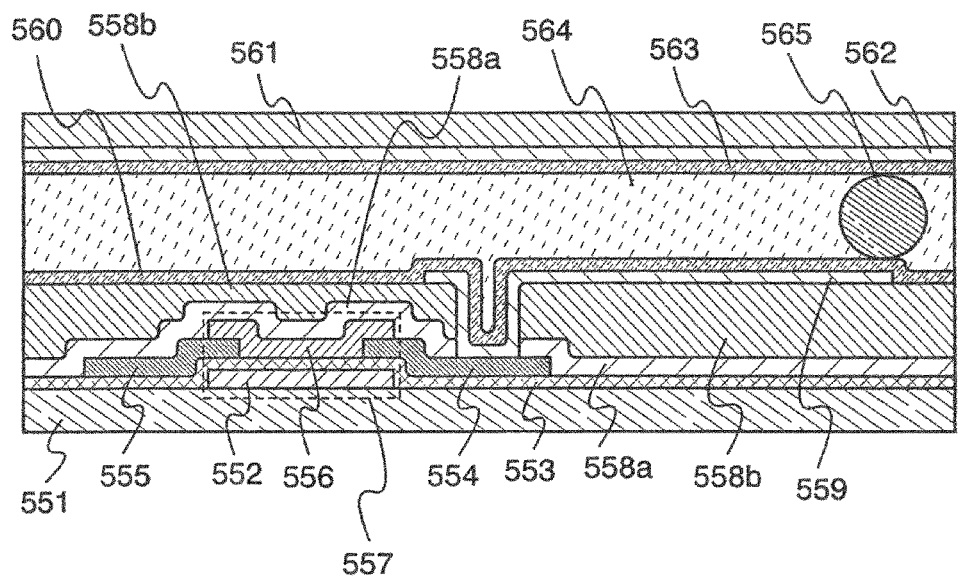

As for the pixel portion 1103, there is no limitation in particular. For example, the pixel portion 1103 includes a liquid crystal element and a transistor for driving the liquid crystal element, as shown in a cross-sectional view of FIG. 12A or FIG. 12B. FIG. 12A and FIG. 12B each show a mode of a cross-sectional structure of the liquid crystal device, and each of them has a different transistor structure.

The liquid crystal device shown in a cross-sectional view of FIG. 12A includes an element substrate 521 provided with a transistor 527 having electrodes 525 and 526 which serves as a source electrode or a drain electrode over an organic semiconductor film 524.

Moreover, a liquid crystal layer 534 is sandwiched between a pixel electrode 529 and an opposing electrode 532. As a material for the pixel electrode 529 and the opposing electrode 532, a light transparent material such as indium tin oxide (ITO) or indium tin oxide including silicon oxide may be used.

Furthermore, orientation films 530 and 533 are provided for the surface sides of the pixel electrode 529 and the opposing electrode 532, which are to be in contact with the liquid crystal layer 534. A spacer 535 is dispersed in the liquid crystal layer to keep a cell gap.

A transistor 527 is covered with an insulating layer 528 in which a contact hole is provided, and the electrode 526 is electrically connected to the pixel electrode 529. The insulating layer 528 may be formed by sputtering or chemical vapor deposition (CVD) using teflon. Moreover, thermal CVD using silicon nitride, silicon oxide silicon nitride oxide or the like may be performed to suppress a deterioration of the organic semiconductor film 524.

The opposing electrode 532 is supported by an opposing substrate 531. The organic semiconductor film 524 is overlapped with a gate electrode 522 with a gate insulating layer 523 therebetween.

In addition, a liquid crystal device shown in a cross-sectional view of FIG. 12B includes an element substrate 551 provided with a transistor 557 having a structure in which at least a portion of electrodes 555 and 554 which serves as a source electrode or a drain electrode is covered with an organic semiconductor film 556. Moreover, a liquid crystal layer 564 is sandwiched between a pixel electrode 559 and an opposing electrode 562. Orientation films 560 and 563 are provided for the surface sides of the pixel electrode 559 and the opposing electrode 562, which are to be in contact with the liquid crystal layer 564. A spacer 565 is dispersed in the liquid crystal layer to keep a cell gap.

A transistor 557 is covered with insulating layers 558a and 558b in which a contact hole is provided, and the electrode 554 is electrically connected to the pixel electrode 559. Note that an insulating layer which covers the transistor 557 may be a laminated layer formed by the insulating layer 558a and the insulating layer 558b as shown in FIG. 12B, or may be a single layer formed by the insulating layer 528 as shown in FIG. 12A. In addition, an insulating layer which covers the transistor 557 may be a layer having a planarized surface like the insulating layer 558b. The insulating layer 558a may be formed as same as the insulating film 528 described above. The insulating film 528b may be formed by spin carting using an organic compound such as acryl, polyimide, or polyimide-amide. In addition, a positive type or negative type photosensitive material may be used.

The opposing electrode 561 is supported by an opposing substrate 562. Moreover, the organic semiconductor film 556 is overlapped with a gate electrode 552 with a gate insulating layer 553 therebetween.

Embodiment Mode 4

Figure 13A:
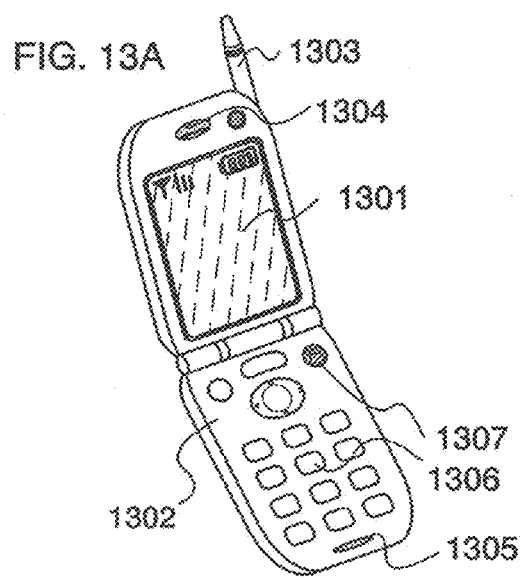
FIGS. 13A to 13C are views of electric appliances and the like to which the invention is applied.
Figure 13B:
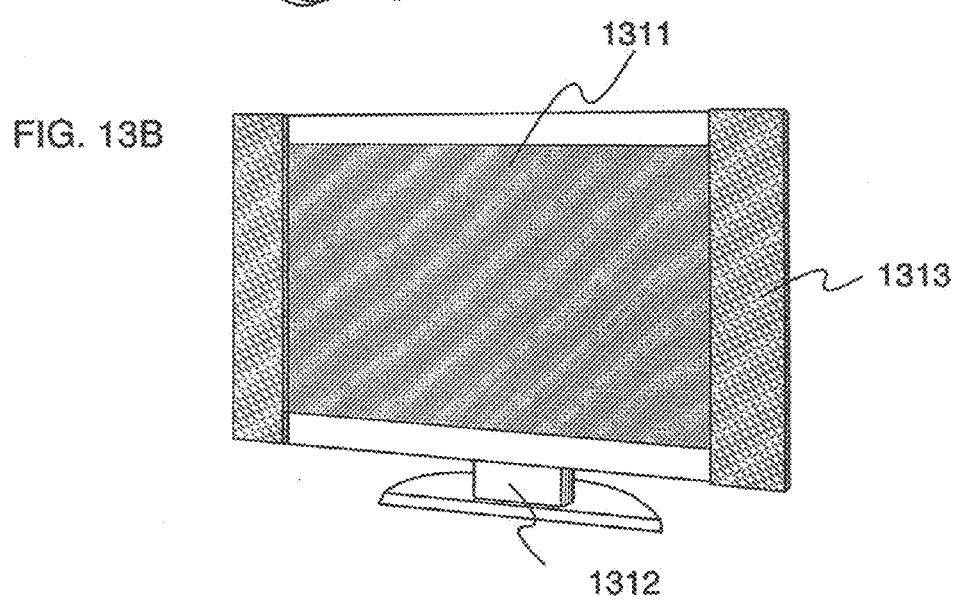
Figure 13C:
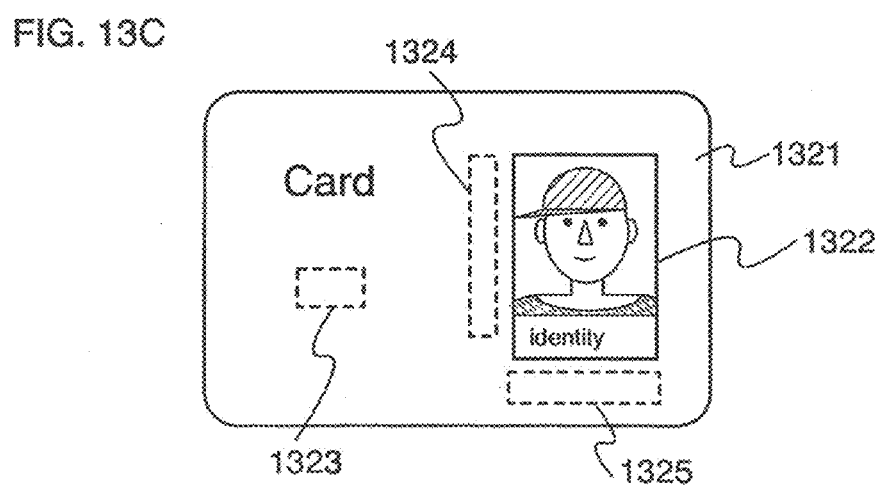

The display device as described above can be used as a display device mounted to a cellular phone, a TV receiver and the like as shown in FIGS. 13A to 13C. Moreover, the display device may be mounted to a card, for example an ID card, which serves to manage personal information.

FIG. 13A shows a view of a cellular phone, which includes a main body 1302 includes a display portion 1301, an audio output portion 1304, an audio input portion 1305, operation keys 1306 and 1307, an antenna 1303, and the like. The cellular phone has high operating characteristic and high reliability. Such a cellular phone can be completed by incorporating the organic semiconductor device of the present invention into the display portion 1301.

FIG. 13B shows a TV receiver manufactured by applying the present invention, which includes a display portion 1311, a casing 1312, speakers 1313, and the like. The TV receiver has high operating characteristic and high reliability. Such a TV receiver can be completed by incorporating the organic semiconductor device of the invention into the display portion 1311.

FIG. 13C shows an ID card manufactured by applying the invention, which includes a support 1321, a display portion 1322, an integrated circuit chip 1323 incorporated in the support 1321, and the like. Note that integrated circuits 1324 and 1325 which drive the display portion 1322 are also incorporated in the support 1321. The ID card has high reliability. Moreover, for example in the display portion 1322, the ID card can display information inputted and outputted in the integrated circuit chip 1323; and thus, what kind of information is inputted and outputted can be confirmed. Such an ID card can be completed by incorporating the organic semiconductor device according to the invention in the display portion 1322.

This application is based on Japanese Patent Application serial no. 2003-434620 field in Japan Patent Office on Dec. 26$^{th}$, 2003, the contents of which are hereby incorporated by reference.

What is claimed is:

1. A method for manufacturing an organic semiconductor element, comprising the steps of:
    forming a gate electrode;
    forming an organic semiconductor film over the gate electrode;
    forming a source electrode and a drain electrode over the organic semiconductor film; and
    heating the organic semiconductor film under atmospheric pressure or under reduced pressure in an inert gas atmosphere after completion of the formation of the organic semiconductor film.

2. A method for manufacturing an organic semiconductor element, comprising the steps of:
    forming a gate electrode;
    forming an organic semiconductor film over the gate electrode;

forming a source electrode and a drain electrode over the organic semiconductor film; and heating the organic semiconductor film under atmospheric pressure or under reduced pressure after completion of the formation of the organic semiconductor film.

3. The method for manufacturing an organic semiconductor element according to claim 1, further comprising a step of forming a gate insulating film over the gate electrode.

4. The method for manufacturing an organic semiconductor element according to claim 2, further comprising a step of forming a gate insulating film over the gate electrode.

5. The method for manufacturing an organic semiconductor element according to claim 2,
wherein the organic semiconductor film is heated in an inert gas atmosphere.

6. The method for manufacturing an organic semiconductor element according to claim 1,
wherein the organic semiconductor film is heated at a temperature which is less than the melting point of the organic semiconductor film.

7. The method for manufacturing an organic semiconductor element according to claim 2,
wherein the organic semiconductor film is heated at a temperature which is less than the melting point of the organic semiconductor film.

8. The method for manufacturing an organic semiconductor element according to claim 1,
wherein the organic semiconductor film is heated at a temperature of less than 250° C.

9. The method for manufacturing an organic semiconductor element according to claim 2,
wherein the organic semiconductor film is heated at a temperature of less than 250° C.

10. The method for manufacturing an organic semiconductor element according to claim 1,
wherein the organic semiconductor film is heated at a temperature such that average value of a grain size of the organic semiconductor film does not grow 10% or more.

11. The method for manufacturing an organic semiconductor element according to claim 2,
wherein the organic semiconductor film is heated at a temperature such that average value of a grain size of the organic semiconductor film does not grow 10% or more.

12. The method for manufacturing an organic semiconductor element according to claim 1,
wherein the organic semiconductor film is formed by depositing pentacene by using a vacuum vapor deposition method.

13. The method for manufacturing an organic semiconductor element according to claim 2,
wherein the organic semiconductor film is formed by depositing pentacene by using a vacuum vapor deposition method.

14. The method for manufacturing an organic semiconductor element according to claim 1,
wherein the organic semiconductor film is heated in a processing chamber in which the organic semiconductor film is formed.

15. The method for manufacturing an organic semiconductor element according to claim 2,
wherein the organic semiconductor film is heated in a processing chamber in which the organic semiconductor film is formed.

16. The method for manufacturing an organic semiconductor element according to claim 1,
wherein the gate electrode or the source electrode and the drain electrode is formed by using a sputtering method, an ink-jetting method, a spin coating method, or a vapor deposition method.

17. The method for manufacturing an organic semiconductor element according to claim 2,
wherein the gate electrode or the source electrode and the drain electrode is formed by using a sputtering method, an ink-jetting method, a spin coating method, or a vapor deposition method.

18. The method for manufacturing an organic semiconductor element according to claim 1,
wherein the gate electrode or the source electrode and the drain electrode is formed by using a conductive film having tungsten.

19. The method for manufacturing an organic semiconductor element according to claim 2,
wherein the gate electrode or the source electrode and the drain electrode is formed by using a conductive film having tungsten.

20. The method for manufacturing an organic semiconductor element according to claim 1 further comprising:
performing a plasma treatment to a surface where the organic semiconductor film is to be formed before forming the organic semiconductor film.

21. The method for manufacturing an organic semiconductor element according to claim 2 further comprising:
performing a plasma treatment to a surface where the organic semiconductor film is to be formed before forming the organic semiconductor film.

22. The method for manufacturing an organic semiconductor element according to claim 1, wherein the gate electrode is formed on a substrate made of synthetic resin.

23. The method for manufacturing an organic semiconductor element according to claim 2, wherein the gate electrode is formed on a substrate made of synthetic resin.

24. The method for manufacturing an organic semiconductor element according to claim 1, wherein the organic semiconductor element is applied to an electronic apparatus selected from the group consisting of a cellular phone, a TV receiver, and an ID card.

25. The method for manufacturing an organic semiconductor element according to claim 2, wherein the organic semiconductor element is applied to an electronic apparatus selected from the group consisting of a cellular phone, a TV receiver, and an ID card.

26. The method for manufacturing an organic semiconductor element according to claim 1, wherein the step of heating occurs before the step of forming the source electrode and the drain electrode.

27. The method for manufacturing an organic semiconductor element according to claim 2, wherein the step of heating occurs before the step of forming the source electrode and the drain electrode.

28. The method for manufacturing an organic semiconductor element according to claim 1, wherein the step of heating occurs after the step of forming the source electrode and the drain electrode.

29. The method for manufacturing an organic semiconductor element according to claim 2, wherein the step of heating occurs after the step of forming the source electrode and the drain electrode.

* * * * *